United States Patent
Li et al.

(10) Patent No.: US 11,716,872 B2
(45) Date of Patent: Aug. 1, 2023

(54) DISPLAY DEVICE AND METHOD FOR MANUFACTURING THE SAME

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Zhuyi Li, Beijing (CN); Qi Liu, Beijing (CN); Zihua Li, Beijing (CN); Qiang Wang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 223 days.

(21) Appl. No.: 16/767,656

(22) PCT Filed: Nov. 26, 2019

(86) PCT No.: PCT/CN2019/120945
§ 371 (c)(1),
(2) Date: May 28, 2020

(87) PCT Pub. No.: WO2020/114277
PCT Pub. Date: Jun. 11, 2020

(65) Prior Publication Data
US 2021/0249622 A1    Aug. 12, 2021

(30) Foreign Application Priority Data
Dec. 6, 2018 (CN) .......................... 201811488878.9

(51) Int. Cl.
*H10K 50/842* (2023.01)
*H10K 59/121* (2023.01)
*H10K 71/00* (2023.01)

(52) U.S. Cl.
CPC ....... *H10K 50/8428* (2023.02); *H10K 59/121* (2023.02); *H10K 71/00* (2023.02)

(58) Field of Classification Search
None
See application file for complete search history.

(56) References Cited

U.S. PATENT DOCUMENTS

| 8,013,341 | B2 | 9/2011 | Jun et al. | |
| 2010/0097295 | A1* | 4/2010 | Kwak | H01L 51/5284 345/32 |

(Continued)

FOREIGN PATENT DOCUMENTS

| CN | 105717687 A | 6/2016 |
| CN | 105845711 A | 8/2016 |

(Continued)

OTHER PUBLICATIONS

The First Office Action of the Search Report dated Dec. 30, 2019 corresponding to Chinese Application No. 201811488878.9.

(Continued)

*Primary Examiner* — Khaja Ahmad
(74) *Attorney, Agent, or Firm* — Nath, Goldberg & Meyer; Joshua B. Goldberg

(57) ABSTRACT

The present disclosure provides a display device and a method for manufacturing the same. The display device includes a display substrate; a first cover plate on a side of the display substrate; at least one support layer on a side of the first cover plate distal to the display substrate. The support layer includes a support structure and a second cover plate. The second cover plate is on a side of the first cover (Continued)

plate distal to the display substrate, and the support structure is configured to support the second cover plate.

8 Claims, 2 Drawing Sheets

(56) References Cited

U.S. PATENT DOCUMENTS

| | | | |
|---|---|---|---|
| 2011/0049502 A1 | 3/2011 | Jun et al. | |
| 2015/0162387 A1* | 6/2015 | Gu ................... | G06F 3/0443 345/174 |
| 2017/0185203 A1* | 6/2017 | Seong ................ | G06F 3/0443 |
| 2017/0207277 A1* | 7/2017 | Park .................. | H01L 27/323 |

FOREIGN PATENT DOCUMENTS

| | | |
|---|---|---|
| CN | 106920826 A | 7/2017 |
| CN | 109585683 A | 4/2019 |

OTHER PUBLICATIONS

The Second Office Action of the Search Report dated Sep. 9, 2020 corresponding to Chinese Application No. 201811488878.9.
Office Action dated Mar. 26, 2021 for application No. CN201811488878.9 with English translation attached.

* cited by examiner

DISPLAY DEVICE AND METHOD FOR MANUFACTURING THE SAME

CROSS-REFERENCE TO RELATED APPLICATIONS

This is a National Phase Application filed under 35 U.S.C. 371 as a national stage of PCT/CN2019/120945, filed Nov. 26, 2019, an application claiming the benefit of Chinese Application No. 201811488878.9, filed Dec. 6, 2018, the content of each of which is hereby incorporated by reference in its entirety.

TECHNICAL FIELD

The present disclosure relates to the field of display technology, and in particular to a display device and a method for manufacturing the same.

BACKGROUND

An OLED display device may include a cover plate and a display substrate close to each other. When an external pressure is applied to the OLED display device, the external pressure is applied to the cover plate to deform the cover plate, so that the deformed cover plate may contact the display substrate and stick to a material in a structure of the display substrate, whereby crushing the display substrate.

SUMMARY

As an aspect, a display device is provided. The display device includes: a display substrate; a first cover plate on a side of the display substrate; and at least one support layer on a side of the first cover plate distal to the display substrate. The support layer includes a support structure and a second cover plate. The second cover plate is on a side of the support structure distal to the first cover plate, and the support structure is configured to support the second cover plate.

In an embodiment, the at least one support layer includes only one support layer, and the support structure is between the first cover plate and the second cover plate.

In an embodiment, each of the support layers includes a plurality of support structures spaced apart from each other.

In an embodiment, the display substrate includes a base substrate, a pixel definition layer for defining a plurality of pixel regions, and a plurality of spacers, and each of the plurality of pixel regions is formed with a first electrode, a light emitting layer and a second electrode therein. The first electrode is on a side of the base substrate. The pixel definition layer is on a same side of the base substrate as the first electrode. The light emitting layer is on a side of the first electrode distal to the base substrate. The plurality of spacers are on a side of the pixel definition layer distal to the base substrate. The second electrode is on a side of the pixel definition layer, the plurality of spacers and the light emitting layer distal to the base substrate. The first cover plate is on a side of the second electrode distal to the base substrate.

In an embodiment, orthographic projections of the plurality of support structures on the base substrate, orthographic projections of the plurality of spacers on the base substrate, and an orthographic projection of the pixel definition layer on the base substrate overlap with each other in a one-to-one correspondence.

In an embodiment, the plurality of support structures have the same material as a material of the plurality of spacers.

In an embodiment, the support structure has a thickness in a range of 500 nm to 2000 nm.

As an aspect, a method for manufacturing a display device is provided. The method includes: forming a first cover plate on a side of a display substrate; and forming at least one support layer each including a support structure and a second cover plate on a side of the first cover plate distal to the display substrate, such that the second cover plate is on a side of the first cover plate distal to the display substrate, and the support structure is configured to support the second cover plate.

In an embodiment, the at least one support layer includes only one support layer. Forming the at least one support layer on the side of the first cover plate distal to the display substrate includes: forming a plurality of support structures spaced from each other on a side of the first cover plate distal to the display substrate; and forming a second cover plate on a side of the plurality of support structures distal to the display substrate.

In an embodiment, forming the plurality of support structures spaced from each other on the side of the first cover plate distal to the display substrate includes: forming a support material layer on a side of the first cover plate distal to the display substrate; and performing a pattern process on the support material layer to form the plurality of support structures.

In an embodiment, the display substrate includes a base substrate, a pixel definition layer for defining a plurality of pixel regions, and a plurality of spacers, and each of the plurality of pixel regions is formed with a first electrode, a light emitting layer, and a second electrode therein. The first electrode is on a side of the base substrate. The pixel definition layer is on the same side of the base substrate as the first electrode. The light emitting layer is on a side of the first electrode distal to the base substrate. The plurality of spacers are on a side of the pixel definition layer distal to the base substrate. The second electrode is on a side of the pixel definition layer, the plurality of spacers and the light emitting layer distal to the substrate. The first cover plate is on a side of the second electrode distal to the base substrate. Forming the plurality of support structures spaced from each other on the side of the first cover plate distal to the display substrate further includes: forming the plurality of support structures such that orthographic projections of the plurality of support structures on the base substrate, orthographic projections of the plurality of spacers on the base substrate, and orthographic projection of the pixel definition layer on the base substrate overlap with each other in a one-to-one correspondence.

In an embodiment, the plurality of support structures are made of the same material as a material of the plurality of spacers.

DETAILED DESCRIPTION

To enable one of ordinary skill in the art to better understand the technical solutions of the present disclosure, the display device and the method for manufacturing the same provided by the present disclosure will be described in detail below with reference to the accompanying drawings.

In the related art, a deformed cover plate may stick to a material in the structure of a display substrate, thereby resulting in defects of the display substrate such as indentations.

Figure 1:
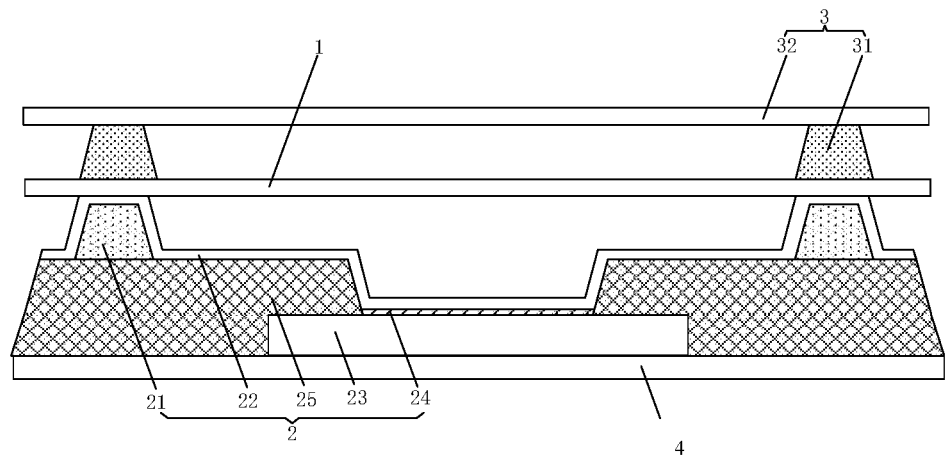
FIG. 1 is a schematic diagram of a structure of a display device according to an embodiment of the present disclosure.

FIG. 1 is a schematic diagram of a structure of a display device according to an embodiment of the present disclosure. As shown in FIG. 1, the display device includes: a first cover plate 1 and a display substrate 2 which are oppositely arranged. At least one support layer 3 is located on a side of the first cover plate 1 distal to the display substrate 2. The support layer 3 includes a support structure 31 and a second cover plate 32. The second cover plate 32 is located on a side of the support structure 31 distal to the first cover plate 2, and the support structure 31 is configured to support the second cover plate 32.

In the embodiment, the number of the support layers 3 is one. In practical applications, the number of the support layers 3 can be set according to the design requirements of the product. For example, the number of the support layers 3 may be two, three, or more. Only one support layer 3 is used in the embodiment, therefore the structure of the display device can be simplified.

In the embodiment, the support structure 31 is located on a side of the first cover plate 1 distal to the display substrate 2. As shown in FIG. 1, the support structure 31 is located on the first cover plate 1, and the second cover plate 32 is located on the support structure 31. The support structure 31 for supporting is between the first cover plate 1 and the second cover plate 32. In one embodiment, the support structure 31 is located between the first cover plate 1 and the second cover plate 32. The first cover plate 1 is spaced apart from the second cover plate 32 by a predetermined distance through the support structure 31 such that the second cover plate 32 is supported by the support structure 31 on the first cover plate 1.

In the embodiment, each of the support layers 3 has a plurality of support structures 31 that are arranged at intervals. Only two support structures 31 are illustrated in FIG. 1 as an example.

In the embodiment, the display device is an OLED display device. The display substrate 2 includes a base substrate 4, a first electrode 23, a light emitting layer 24, and a second electrode 22. The second electrode 22 is located on a side of the first cover plate 1 distal to the second cover plate 32. The first electrode 23 is located on a side of the second electrode 22 distal to the first cover plate 1. The light emitting layer 24 is located between the first electrode 23 and the second electrode 22. Specifically, the light emitting layer 24 is located on the first electrode 23, the second electrode 22 is located on a side of the light emitting layer 24 distal to the first electrode 23, and the first cover plate 1 is located on a side of the second electrode 22 distal to the first electrode 23. In an embodiment, the first electrode 23 is an anode, and the second electrode is a cathode. The first electrode 23 may include a plurality of sub-electrode layers, for example, three sub-electrode layers respectively made of ITO, Ag, and ITO.

In an embodiment, the display substrate 2 further includes a plurality of spacers 21 and a pixel definition layer 25. The pixel definition layer 25 defines a plurality of pixel regions, and the light emitting layer 24 is located in the pixel regions. The pixel definition layer 25 is located between the first electrode 23 and the second electrode 22, and the spacer 21 is located between the pixel definition layer 25 and the second electrode 22. Specifically, the spacer 21 is located above the pixel definition layer 25. The second electrode 22 covers both sidewalls of the spacer 21 and a surface of the spacer 21 distal to the pixel definition layer 25, covers (e.g., completely covers) a surface of the pixel definition layer 25 distal to the first electrode 23, and covers (e.g., completely covers) a surface of the light emitting layer 24 distal to the first electrode 23.

In an embodiment, the display substrate includes a base substrate 4, a first electrode 23, a second electrode 22, a light emitting layer 24, a pixel definition layer 25, and a plurality of spacers 21. The pixel definition layer 25 defines a plurality of pixel regions. The first electrode 23 is located in the pixel regions and on a side of the base substrate 4. The pixel definition layer 25 is located on a same side of the base substrate 4 as the first electrode 23 and covers (e.g., completely covers) the anode 23. The light emitting layer 24 is located in the pixel region and on a side of the first electrode 23 distal to the base substrate 4. The plurality of spacers 21 are located on a side of the pixel definition layer 25 distal to the base substrate 4 and on the pixel definition layer 25. The second electrode 22 is located on a side of the pixel definition layer 25, the plurality of spacers 21, and the light emitting layer 23 distal to the base substrate 4, and covers (e.g., completely covers) the pixel definition layer 25, the plurality of spacers 21, and the light emitting layer 23. The first cover plate 1 is located on a side of the second electrode 22 distal to the base substrate 4. The pixel definition layer 25 has a mesh shape surrounding the plurality of pixel regions, when viewing from the top view. A through hole is formed in the pixel definition layer 25 through which the anode 23 is coupled to a drain electrode of a thin film transistor in the base substrate 4.

The display substrate 2 has a plurality of first electrodes 23, and the plurality of first electrodes 23 are spaced apart from each other and independently controlled, respectively. The display substrate 2 has the second electrode 22. The second electrode 22 extends throughout the surfaces of the pixel definition layer 25, the light emitting layer 24, and the plurality of spacers 21 distal to the base substrate 4 to be formed as one piece and to be controlled as a whole.

The display substrate 2 further includes a hole injection layer, a hole transport layer, an electron transport layer, and an electron injection layer disposed sequentially. The hole transport layer and the hole injection layer are located between the first electrode 23 and the light emitting layer 24. The hole injection layer is disposed close to the first electrode 23, and the hole transport layer is disposed close to the light emitting layer 24. The electron injection layer and the electron transport layer are located between the light emitting layer 24 and the second electrode 22. The electron transport layer is disposed close to the light emitting layer 24, and the electron injection layer is disposed close to the second electrode 22. In an embodiment, all of the hole injection layer, the hole transport layer, the electron transport layer, and the electron injection layer are located in the pixel region. The hole injection layer, the hole transport layer, the electron transport layer, and the electron injection layer are not shown in the drawings.

In an embodiment, the display substrate includes a plurality of spacers 21, and the plurality of spacers 21 are arranged at intervals. Only two spacers 21 are illustrated in FIG. 1 as an example.

In the embodiment, each of the support structures 31 corresponds to a corresponding spacer 21. Specifically, the support structure 31 is located on the first cover plate 1 above the corresponding spacer 21. Orthographic projections of the plurality of support structures 31 on the display substrate 2, orthographic projections of the plurality of spacers 21 on the display substrate 2, and an orthographic projection of the pixel definition layer 25 on the display substrate 2 are completely overlapped with each other in a one-to-one correspondence manner.

In an embodiment, a material of the support structure 31 is the same as a material of the spacer 21. For example, the material of the support structure 31 is a photoresist.

In the present embodiment, a thickness of the support structure 31 ranges from 500 nm to 2000 nm. In a case where the support structure 31 has a thickness in above range, the support structure 31 can better resist the external pressure.

Figure 2:
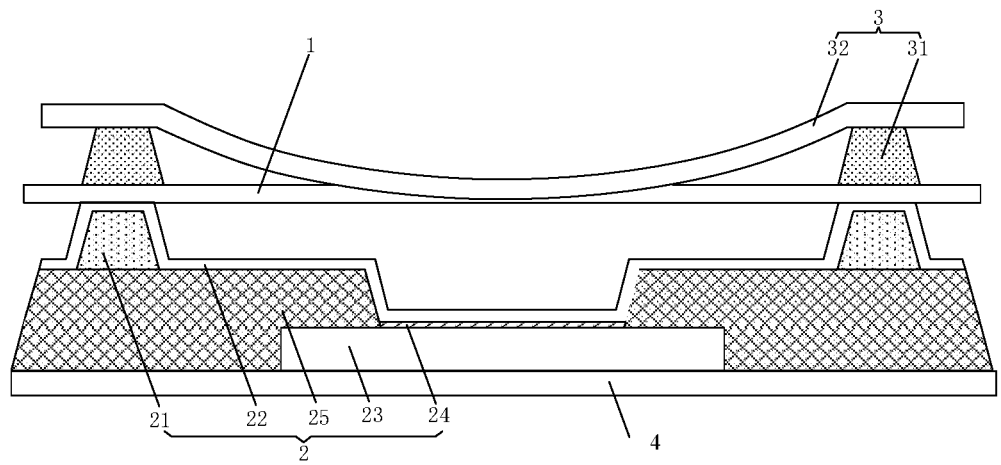
FIG. 2 is a schematic diagram showing a state where an external pressure is applied to the display device.

FIG. 2 is a schematic diagram showing a state where an external pressure is applied to the display device. As shown in FIG. 2, when the external pressure is applied to the display device, the external pressure is applied to the second cover plate 32, so that the second cover plate 32 deforms. Since the second cover plate is subjected to the external pressure, the first cover plate 1 does not deform, and in turn the first cover plate 1 does not stick to the material of the second electrode 22 in the display substrate 2. Further, even if the second cover plate 32 is deformed to contact with the first cover plate 1, the material of the second electrode 22 cannot stick to the first cover plate 1, thereby realizing that the material of the structure in the display substrate 2 cannot stick to the first cover plate 1.

In the display device provided by the embodiment, at least one support layer including the support structure and the second cover plate is located on a side of the first cover plate distal to display substrate. When the external pressure is applied to the display device, only the second cover plate is subjected to the external pressure, therefore the first cover plate 1 does not deform, and the material of the structure in the display substrate cannot stick to the first cover plate, thereby avoiding the defects of the display substrate such as indentations.

Figure 3:
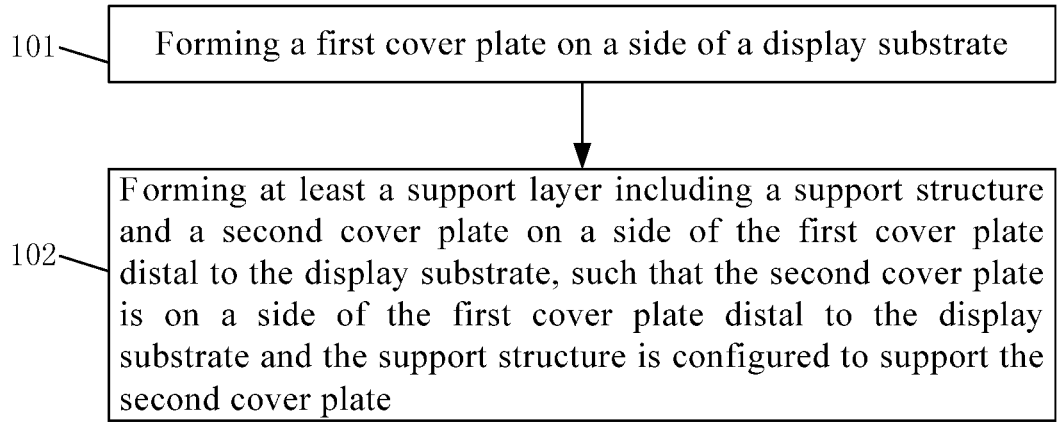
FIG. 3 is a flowchart showing a method for manufacturing a display device according to an embodiment of the present disclosure.

FIG. 3 is a flowchart showing a method for manufacturing a display device according to an embodiment of the present disclosure. As shown in FIG. 3, the method includes steps S101 and S102.

At Step 101, a first cover plate is formed on a side of a display substrate.

In an embodiment, the display substrate may be bonded to the first cover plate to realize that the display substrate and the first cover plate are oppositely disposed.

At Step 102, at least one support layer is formed on a side of the first cover plate distal to the display substrate. The support layer includes a support structure and a second cover plate. The second cover plate is located on a side of the first cover plate distal to the display substrate, and the support structure is configured to support the second cover plate.

In an embodiment, the number of the support layers is one. Specifically, Step 102 includes steps S1021 and S1022.

At Step 1021, a plurality of support structures spaced from each other are formed on a side of the first cover plate distal to the display substrate.

Specifically, at Step 1021, a support material layer is formed on a side of the first cover plate distal to the display substrate, and a pattern process is performed on the support material layer to form the plurality of support structures. The material of the support structures 31 is a photoresist, and the pattern process includes exposure and development processes.

At Step 1022, the second cover plate is formed on a side of the plurality of support structures distal to the display substrate.

In the embodiment, the second cover plate may be bonded to the first cover plate with the support structure between the first and second cover plates, that is, the second cover plate is formed on a side of the support structure distal to the first cover plate.

In an embodiment, the plurality of support structures are formed such that orthographic projections of the plurality of support structures on the display substrate, orthographic projections of the plurality of spacers on the display substrate, and an orthographic projection of the pixel definition layer on the display substrate overlap with each other in a one-to-one correspondence. In an embodiment, the plurality of support structures are made of the same material as that of the plurality of spacers.

In the method for manufacturing the display device provided by the embodiment, at least one support layer including a support structure and a second cover plate is formed on a side of the first cover plate distal to the display substrate. When an external pressure is applied to the display device, the second cover plate is subjected to the external pressure, so that the first cover plate does not deform, and in turn the first cover plate cannot touch/contact the material of structures in the display substrate, thereby preventing the defects of the display substrate such as indentations.

It should be understood that the above implementations are merely exemplary embodiments for the purpose of illustrating the principles of the present disclosure, however, the present disclosure is not limited thereto. It will be apparent to those skilled in the art that various changes and modifications can be made without departing from the spirit and spirit of the present disclosure, which are also to be regarded as the scope of the present disclosure.

What is claimed is:

1. A display device, comprising:
a display substrate;
a first cover plate on a side of the display substrate, with a portion of the first cover plate spaced apart from the display substrate by a first predetermined distance; and
at least one support layer on a side of the first cover plate distal to the display substrate;
wherein each of the at least one support layer comprises a support structure and a second cover plate, the second cover plate is on a side of the support structure distal to the first cover plate, and the support structure is configured to support the second cover plate such that the second cover plate is spaced apart from the first cover plate by a second predetermined distance,
each of the at least one support layer comprises a plurality of support structures spaced apart from each other,
the display substrate comprises a base substrate, a pixel definition layer for defining a plurality of pixel regions, and a plurality of spacers, and each of the plurality of pixel regions is formed with a first electrode, a light emitting layer and a second electrode therein, the first electrode is on a side of the base substrate, the pixel definition layer is on the same side of the base substrate as the first electrode, the light emitting layer is on a side of the first electrode distal to the base substrate, the plurality of spacers are on a side of the pixel definition layer distal to the base substrate, the second electrode is on a side of the pixel definition layer, the plurality of spacers and the light emitting layer distal to the base substrate, and the first cover plate is on a side of the second electrode distal to the base substrate, and
the plurality of support structures have the same material as a material of the plurality of spacers.

2. The display device according to claim 1, wherein the at least one support layer comprises only one support layer, and the support structure is between the first cover plate and the second cover plate.

3. The display device according to claim 1, wherein
orthographic projections of the plurality of support structures on the base substrate and orthographic projections of the plurality of spacers on the base substrate overlap with each other in a one-to-one correspondence, and
the orthographic projections of the plurality of support structures on the base substrate and the orthographic projections of the plurality of spacers on the base substrate are within an orthographic projection of the pixel definition layer on the base substrate.

4. The display device according to claim 1, wherein the support structure has a thickness in a range of 500 nm to 2000 nm.

5. A method for manufacturing a display device, comprising:
forming a first cover plate on a side of a display substrate such that a portion of the first cover plate is spaced apart from the display substrate by a first predetermined distance; and
forming at least one support layer each comprising a second cover plate and a support structure supporting the second cover plate on a side of the first cover plate distal to the display substrate, such that the second cover plate is spaced apart from the first cover plate by a second predetermined distance,
forming the at least one support layer on the side of the first cover plate distal to the display substrate comprises: forming a plurality of support structures spaced from each other on a side of the first cover plate distal to the display substrate; and forming the second cover plate on a side of the plurality of support structures distal to the display substrate,
the method further comprises: forming the display substrate comprising a base substrate, a pixel definition layer for defining a plurality of pixel regions, and a plurality of spacers, each of the plurality of pixel regions being formed with a first electrode, a light emitting layer, and a second electrode therein, such that the first electrode is on a side of the base substrate, the pixel definition layer is on the same side of the base substrate as the first electrode, the light emitting layer is on a side of the first electrode distal to the base substrate, the plurality of spacers are on a side of the pixel definition layer distal to the base substrate, the second electrode is on a side of the pixel definition layer, the plurality of spacers and the light emitting layer distal to the substrate, and the first cover plate is on a side of the second electrode distal to the base substrate, and
the plurality of support structures are made of the same material as a material of the plurality of spacers.

6. The method according to claim 5, wherein
the at least one support layer comprises only one support layer.

7. The method according to claim 6, wherein forming the plurality of support structures spaced from each other on the side of the first cover plate distal to the display substrate comprises:
forming a support material layer on a side of the first cover plate distal to the display substrate; and
performing a pattern process on the support material layer to form the plurality of support structures.

8. The method according to claim 7, wherein
forming the plurality of support structures spaced from each other on the side of the first cover plate distal to the display substrate further comprises: forming the plurality of support structures such that orthographic projections of the plurality of support structures on the base substrate and orthographic projections of the plurality of spacers on the base substrate overlap with each other in a one-to-one correspondence, and the orthographic projections of the plurality of support structures on the base substrate and the orthographic projections of the plurality of spacers on the base substrate are within an orthographic projection of the pixel definition layer on the base substrate.

* * * * *